(12) United States Patent
Hoberman et al.

(10) Patent No.: US 7,945,885 B2
(45) Date of Patent: *May 17, 2011

(54) POWER MANAGERS FOR AN INTEGRATED CIRCUIT

(75) Inventors: Barry Alan Hoberman, Cupertino, CA (US); Daniel L. Hillman, San Jose, CA (US); Jon Shiell, San Jose, CA (US)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 397 days.

This patent is subject to a terminal disclaimer.

(21) Appl. No.: 12/176,645

(22) Filed: Jul. 21, 2008

(65) Prior Publication Data
US 2008/0276105 A1 Nov. 6, 2008

Related U.S. Application Data

(63) Continuation of application No. 11/336,097, filed on Jan. 20, 2006, now Pat. No. 7,415,680, which is a continuation of application No. 10/840,893, filed on May 7, 2004, now Pat. No. 7,051,306.

(60) Provisional application No. 60/468,742, filed on May 7, 2003.

(51) Int. Cl.
*G06F 17/50* (2006.01)

(52) U.S. Cl. ........ 716/133; 716/100; 716/126; 716/127; 716/132

(58) Field of Classification Search .................. 716/100, 716/126, 127, 132, 133
See application file for complete search history.

(56) References Cited

U.S. PATENT DOCUMENTS

| 5,778,237 | A  | 7/1998  | Yamamoto et al. |
| 5,996,084 | A  | 11/1999 | Watts |
| 6,307,281 | B1 | 10/2001 | Houston |
| 6,438,635 | B1 | 8/2002  | Date et al. |
| 6,462,976 | B1 | 10/2002 | Olejniczak et al. |
| 6,523,150 | B1 | 2/2003  | Buffet et al. |
| 6,598,148 | B1 | 7/2003  | Moore et al. |
| 6,631,502 | B2 | 10/2003 | Buffet et al. |
| 6,667,648 | B2 | 12/2003 | Stout et al. |
| 6,779,163 | B2 | 8/2004  | Bednar et al. |
| 6,779,169 | B1 | 8/2004  | Singh et al. |
| 6,820,240 | B2 | 11/2004 | Bednar et al. |
| 6,883,152 | B2 | 4/2005  | Bednar et al. |
| 7,111,178 | B2 | 9/2006  | Rusu et al. |

(Continued)

FOREIGN PATENT DOCUMENTS
CN 1353454 A 6/2002
(Continued)

OTHER PUBLICATIONS

Nowka, et al., "A 0.9V to 1.95V Dynamic Voltage-Scalable and Frequency-Scalable 32b PowerPC Processor," *IEEE International Solid-State Circuits Conference 20.4* (Feb. 6, 2002).

(Continued)

*Primary Examiner* — Sun J Lin
(74) *Attorney, Agent, or Firm* — Hamilton, Brook, Smith & Reynolds, P.C.

(57) ABSTRACT

A system for an integrated circuit comprising a plurality of power islands includes a first power manager and a second power manager. The first power manager manages a first power consumption for the integrated circuit based on needs and operation of the integrated circuit. The second power manager communicates with the first power manager and manages a second power consumption for one of the power islands.

64 Claims, 13 Drawing Sheets

U.S. PATENT DOCUMENTS

| | | |
|---|---|---|
| 7,279,956 B2 | 10/2007 | Caplan et al. |
| 2008/0088358 A1 | 4/2008 | Caplan et al. |

FOREIGN PATENT DOCUMENTS

| | | |
|---|---|---|
| JP | 11-045225 | 2/1999 |
| JP | 2003-108260 | 4/2003 |

OTHER PUBLICATIONS

"Solving the Power Management Dilemma in System-On-Chip ASIC Design," Apr. 2002, IBM Technology Group.

Lackey et al., "Managing Power and Performance for System-on-Chip Designs using Voltage Islands," IEEE International Conference on Computer Aided Design, Technical Paper, Nov. 2002, pp. 195-202.

Semeraro et al., "Dynamic Frequency and Voltage Control for Multiple Clock Domain Microarchitecture," 35th Annual IEEE/ACM International Symposium on Microarchitecture, Proceedings, Nov. 2002, pp. 356-367.

Akui et al., "Dynamic Voltage and Frequency Management for Low-Power Embedded Microprocessor," IEEE International Solid-State Circuits Conference, Digest of Technical Papers, Feb. 2004, vol. 1, pp. 64-513.

Talpes et al., "Toward a Multiple Clock/Voltage Island Design Style for Power-Aware Processors," IEEE Transactions on Very Large Scale Integration (VLSI) system, May 2005, pp. 591-603, v. 13, iss. 5.

Gupta, R. et al., "Low Power Wireless Networked System Design," HotChips, Aug. 18, 2002, Stanford, CA.

Tsai, Y-F et al., "Implications of Technology Scaling on Leakage Reduction Techniques," DAC 2003, Jun. 2-6, 2003, ACM, Anaheim, CA, USA.

Li, L. et al., "Managing Leakage Energy in Cache Hierarchies," Journal of Instruction-Level Parallelism, 2003, pp. 1-24, vol. 5.

Hu, J. S. et al., "Using Dynamic Branch Behavior for Power-Efficient Instruction Fetch," Proc. of IEEECS Annual Symposium on VLSI ((ISVLSI 2003), Feb. 20-21, 2003, Tampa, FL.

Zhang, W. et al., "Compiler Support for Reducing Leakage Energy Consumption," Proceedings of the 6th Design Automation and Test in Europe Conference (DATE-03), Mar. 2003, Munich, Germany.

Degalahal, V. et al., "Analyzing Soft Errors in Leakage Optimized SRAM Design," Proceedings of the 16th International Conference on VLSI Design, Jan. 2003, New Delhi, India.

Li, L. et al., "Leakage Energy Management in Cache Hierarchies," 11th International Conference on Parallel Architectures and Compilation Techniques (PACT '02), Sep. 2002.

Duarte, D. et al., "Impact of Scaling on the Effectiveness of Dynamic Power Reduction Schemes," Proceedings of the 20th International Conference on Computer Design (ICCD), Sep. 16-18, 2002, Frieberg, Germany.

Duarte, D. et al., "Impact of Technology Scaling and Packaging on Dynamic Voltage Scaling Techniques," Proceedings of the 15th Annual IEEE International ASIC/SOC Conference, Sep. 25-28, 2002, Rochester, NY.

Kim, S. et al., "Predictive Precharging for Bitline Leakage Energy Reduction," Proceedings of 15th Annual IEEE International ASIC/SOC Conference, Sep. 25-28, 2002, Rochester, NY.

Ramanarayanan, R. et al., "Characterizing Dynamic and Leakage Power Behavior in Flip Flops," Proceedings of the 15th Annual IEEE International ASIC/SOC Conference, Sep. 2002.

Chen, G. et al., "Adaptive Garbage Collection for Battery-Operated Environments," Proceedings of USENIX JVM02 Symposium, Aug. 2002.

Chen, G. et al., "Energy Savings Through Compression in Embedded JavaEnvironments," Proceedings of the CODES 02, Jun. 2002.

De La Luz, V. et al., "Hardware and Software Techniques for Controlling DRAM Power Modes," IEEE Transaction on Computers, Nov. 2001, vol. 50.

De La Luz, V. et al., "Scheduler-Based DRAM Energy Management," DAC 2002, Jun. 10-14, 2002, New Orleans, LA USA, ACM.

Kim, S. et al., "Partitioned Instruction Cache Architecture for Energy Efficiency," ACM Transactions on Computational Logic, Jul. 2002, pp. 1-23, vol. V, No. N.

De La Luz, V. et al., "Automatic Data Migration for Reducing Energy Consumption in Multi-Bank Memory Systems," DAC 2002, Jun. 10-14, 2002, New Orleans, LA, USA.

Duarte, D. et al., "Impact of Technology Scaling in the Clock System Power," Proceedings of the IEEE Computer Society Annual Symposium on VLSI, Apr. 25-26, 2002, Pittsburgh, PA.

Duarte, D. et al., "A Complete Phase-Locked Loop Power Consumption Model," Proceedings of the 2002 Design, Automation and Test in Europe Conference and Exhibition (DATE '02), 2002, IEEE.

Duarte, D. et al., "Evaluating Run-Time Techniques for Leakage Power Reduction," Proceedings of the 15th International Conference on VLSI Design (VLSID '02) 2002, IEEE.

Zhang, W., "Exploiting VLIW Schedule Slacks for Dynamic and Leakage Energy Reduction," Proceedings of the 34th Anual International Symposium on Microarchitecture (MICRO '01), Dec. 2001.

Kim, S. et al., "Energy Efficient Instruction Cache Using Page-Based Placement," Proceedings of International Conference on Compilers, Architectures and Synthesis for Embedded Systems, CASES '01, Nov. 1-17, 2001, Atlanta, GA, USA.

Hezavei, J. et al., "Input Sensitive High-Level Power Analysis," Proceedings of the 2001 IEEE Workshop on Signal Processing Systems (SiPS), Sep. 2001, pp. 149-156.

Kim, S. et al. "Power-Aware Partitioned Cache Architectures," Proceedings of ACM/IEEE International Symposium on Low Power Electronics and Design, 2001, ILSPED '01, Aug. 6-7, 2001, Huntington Beach, CA.

De La Luz, V., "DRAM Energy Management Using Software and Hardware Directed Power Mode Control," Proceedings of the 7th International Symposium on High Performance Computer Architecture, Jan. 20-24, 2001, Monterrey, Mexico.

De Micheli, G. et al., "System-Level Power Optimization: Techniques and Tools ," Date 2000.

Manne, S. et al., "Cool Chips Tutorial," 32nd Annual International Symposium on Microarchitecture, Nov. 15, 1999, Haifa, Israel.

Filseth, E., "Tally Power into Cost of 'Free' Silicon," EETimes, Jan. 11, 1999, located at http://www.eetimes.com/story/speakout/OEG19990111S028.

Frenkil, J., "A Multi-Level Approach to Low-Power IC Design," IEEE Spectrum, Feb. 1998, vol. 35, No. 2.

"Managing Power in Ultra Deep Submicron ASIC/IC Design," May 2002, Synopsys, Inc.

Pangrle, B. "Low-Power Design: A Holistic Approach in an Era of New Semiconductor Technologies," San Diego Telecom Council Semiconductor SIG, Nov. 14, 2002.

Rabaey, J., "Design Aids for Low Power: Part II Architecture and System Levels," 1997.

Grunwald, D. et al., "Kool Chips Workshop," MICRO33, Dec. 10, 2000, Monterey, CA.

Flynn, J. et al., "Power Management in Complex SoC Design," Synopsys, Apr. 2004, located at http://www.synopsis.com/sps.

Halter et al., "A Gate-Level Leakage Power Reduction Method for Ultra-Low-Power CMOS Circuits," in Proc. IEEE Custom Integrated Circuits Conf., 1997, pp. 475-478.

Horiguchi et al., "Switched-Source-Impedance CMOS Circuit for Low Standby Subthreshold Current Giga-Scale LSI's," IEEE Journal of Solid-State Circuits, Nov. 1993, vol. 28, No. 11.

Kao et al., "Dual-Threshold Voltage Techniques for Low-Power Digital Circuits," IEEE Journal of Solid-State Circuits, Jul. 2000, vol. 35, No. 7.

Mutoh, "1-V Power Supply High-Speed Digital Circuit Technology with Multithreshold-Voltage CMOS," IEEE Journal of Solid-State Circuits, Aug. 1995, vol. 35, No. 8.

Nowka, et al., "A 32-bit PowerPC System-on-a-Chip With Support for Dynamic Voltage Scaling and Dynamic Frequency Scaling," *IEEE Journal of Solid-State Circuits*, vol. 37, No. 11, pp. 1441-1447 (Nov. 2002).

Nowka, et al., "The Design and Application of the PowerPC 405LP Energy-Efficient System-on-a-Chip," *IBM J. Res. & Dev.*, vol. 47. No. 5/6, pp. 631-639 (Sep./Nov. 2003).

Semeraro, et al., "Energy-Efficient Processor Design Using Multiple Clock Domains with Dynamic Voltage and Frequency Scaling," *Proceedings of the Eighth International Symposium on High-Performance Computer Architecture* (2002).

Search Report: ROC (Taiwan) Patent Application No. 093112998 (Translation), completed Oct. 31, 2010.

U.S. Office Action mailed Feb. 14, 2011 for U.S. Appl. No. 12/332,529.

POWER MANAGERS FOR AN INTEGRATED CIRCUIT

CROSS-REFERENCE TO RELATED APPLICATIONS

This application is a continuation of U.S. application Ser. No. 11/336,097 filed on Jan. 20, 2006 entitled "Power Managers for an Integrated Circuit" and which issued on Aug. 19, 2008 as U.S. Pat. No. 7,415,680, which is a continuation of U.S. application Ser. No. 10/840,893 filed on May 7, 2004 and entitled "Managing Power on Integrated Circuits Using Power Islands" and which issued on May 23, 2006 as U.S. Pat. No. 7,051,306 which claims the benefit of U.S. Provisional Application Ser. No. 60/468,742 titled "System and Method for Managing Power in Integrated Circuits," filed May 7, 2003, which are each hereby incorporated by reference.

BACKGROUND

1. Field of the Invention

The present invention relates generally to integrated circuits, and more particularly to managing power on integrated circuits using power islands.

2. Description of the Prior Art

One design goal for integrated circuits is to reduce power consumption. Devices with batteries such as cell phones and laptops especially need a reduction in power consumption in the integrated circuit to extend the charge of the battery. Additionally, a reduction in power consumption prevents overheating and lowers the heat dissipation of the integrated circuit, which in some cases, eliminates or simplifies the heat sinks and/or fans for the integrated circuit.

Some integrated circuits are designed using building blocks of library cells. These library cells are blocks of circuitry performing a function. Some examples of library cells are NAND gates, multiplexers, decoders, comparators, and memory.

In a "full-custom" flow, the integrated circuit is designed at the lowest level such as at the individual transistors, capacitors, and resistors level. The "full-custom" flow may use library cells that are internally developed. The integrated circuit can have optimal performance because the integrated circuit is designed in great detail at the lowest level. However, some problems with the "full-custom" flow are the long time and expensive costs associated with designing at such a detailed level. Furthermore, the "full-custom" flow is cumbersome because the design is at the lowest level.

In a "standard-cell" flow, the integrated circuit is designed using library cells acquired from a third party or other outside source. These library cells are standardized at the logic or function level. The design time for the standard-cell flow is reduced because the library cells are already pre-designed and pre-tested.

In one example for designing an integrated circuit, the library cells are selected, and the custom logic is specified to build the integrated circuit. The register transfer level (RTL) for the integrated circuit is then written for simulation and debugging. After simulation and debugging, the synthesis is run for the integrated circuit. Performance measurement software is executed to determine performance of the integrated circuit. The final synthesis of the integrated circuit can then be run based on the optimal performance of the integrated circuit.

One problem with many integrated circuits is that power consumption is not efficiently utilized. For example, the entire integrated circuit may operate at a maximum frequency just to support an application needing that maximum frequency, while other portions of the integrated circuit can operate at a lower frequency. In another example, inactive circuitry within the integrated circuit consumes power and increases the likelihood of leakage. Inefficient power consumption may also adversely affect performance of the integrated circuit.

With the growing complexity of integrated circuits, the reduction of power consumption is even more important when the integrated circuit employs more functionality. One example of an integrated circuit is a system-on-a-chip that includes a microprocessor, memory, I/O interfaces, and an analog-to-digital converter all in a single chip. With many different types of functionality employed within a single chip, the system-on-a-chip consumes even more power than single function integrated circuits.

Some prior integrated circuits have employed voltage islands or multiple clocks to lower power consumption. One problem with these integrated circuits is that the voltages in the power island and the frequencies of the multiple clocks are static. The voltages and the frequencies do not dynamically change based on the needs and operation of the integrated circuit.

SUMMARY OF THE INVENTION

The invention addresses the above problems by providing power managers for an integrated circuit. A system for an integrated circuit comprising a plurality of power islands includes a first power manager and a second power manager. The first power manager manages a first power consumption for the integrated circuit based on needs and operation of the integrated circuit. The second power manager communicates with the first power manager and manages a second power consumption for one of the power islands.

The first power manager may determine power trade offs between the power islands. The second power manager may determine status information about the one of the power islands and may transmit the status information to the first power manager. The first power manager may receive the status information and may manage the first power consumption for the integrated circuit using the status information. The first power manager may determine status information about the integrated circuit and may transmit the status information to power interface software. The first power manager may receive a message from power interface software to change the first power consumption for the integrated circuit. The first power manager may transmit a message to the second power manager and the second power manager may receive and process the message to change the second power consumption for the one of the power islands. The second power manager may register capabilities of the second power manager with the first power manager.

DETAILED DESCRIPTION OF THE INVENTION

Figure 1:
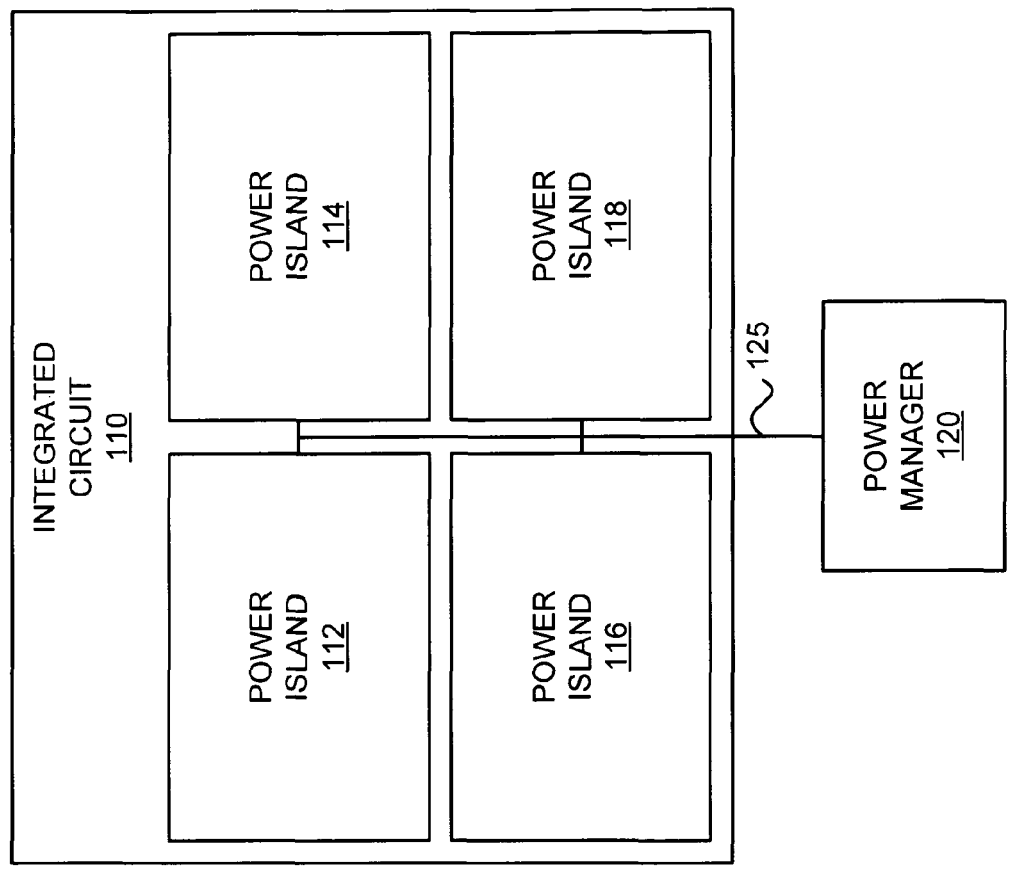
FIG. 1 is a block diagram of a system for managing power in an integrated circuit in an exemplary implementation of the invention.

As shown in the exemplary drawings wherein like reference numerals indicate like or corresponding elements among the figures, exemplary embodiments of a system and method according to the present invention are described below in detail. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure, method, process or manner.

FIG. 1 depicts a block diagram of a system 100 for managing power in an integrated circuit 110 in an exemplary implementation of the invention. The system 100 includes an integrated circuit 110 and a power manager 120. The integrated circuit 110 is any electronic device that is instantiated into silicon and/or related manufacturing materials. One example of the integrated circuit 110 is a system-on-a-chip. The integrated circuit 110 includes multiple IP units, which are blocks of circuitry performing specific functions.

The integrated circuit 110 includes four power islands 112, 114, 116, and 118. FIG. 1 only depicts four power islands 112, 114, 116, and 118 for the sake of simplicity. Other embodiments of the integrated circuit 110 include a plurality of power islands 112, 114, 116, and 118. The power islands 112, 114, 116, and 118 are coupled to a bus 125.

A power island 112, 114, 116, and 118 is any section, delineation, partition, or division of the integrated circuit 110 where power consumption is controlled within the section, delineation, partition, or division. In some embodiments, the power islands 112, 114, 116, and 118 are delineated based on geographic factors of the integrated circuit 110. In some embodiments, the power islands 112, 114, 116, and 118 are delineated based on functional IP units of the integrated circuit 110. In one example depicted in FIG. 10, power islands are delineated by memory, a microprocessor, and separate IP blocks. In some embodiments, the power islands 112, 114, 116, and 118 are asynchronous or synchronous to each other.

In some embodiments, the power islands 112, 114, 116, and 118 comprise sub-islands of power to provide further specificity in controlling power in the integrated circuit 110. In some embodiments, each of the power islands 112, 114, 116, and 118 supports multiple clock domains with its own control. In some embodiments, the clocks within the power islands 112, 114, 116, and 118 are variable.

In some embodiments, each of the power islands 112, 114, 116, and 118 includes power control circuitry. Power control circuitry is any circuitry configured to control power within one of the power islands 112, 114, 116, and 118. Some examples of power control circuitry include circuitry for level shifting, signal isolation, Vdd multiplexing, clock multiplexing, and dynamic back bias. In some embodiments, the power control circuitry is included in a standard cell library for standard cell design of the integrated circuit 110.

The power manager 120 is also coupled to the bus 125. One example of the bus 125 is a power command bus described in further detail below in FIG. 10. Other embodiments of the system 100 include numerous variations in which the power manager 120 and the power islands 112, 114, 116, and 118 are interconnected. The power manager 120 is any circuitry, device, or system configured to (1) determine a target power level for one of the power islands 112, 114, 116, and 118 where power consumption is independently controlled within each of the power islands 112, 114, 116, and 118, (2) determine action to change a consumption power level of the one of the power islands 112, 114, 116, and 118 to the target power level, and (3) perform the action to change the consumption power level of the one of the power islands 112, 114, 116, and 118 to the target power level. The power manager 120 can dynamically change the power consumption of the power islands 112, 114, 116, and 118 based on the needs and operation of the integrated circuit 110. The target power level is a desired, calculated, or specified power consumption of the power islands 112, 114, 116, and 118. Some examples of the power manager 120 are the slave power manager (SPM), the intermediate power manager (IPM), and the master power manager (MPM), which are described in further detail below. The power manager 120 may be a hierarchy or group of power managers 120. Although FIG. 1 depicts the power manager 120 as being located outside the integrated circuit 110, other embodiments may have the power manager 120 located in the integrated circuit 110. In other embodiments, the power manager 120 may be distributed among multiple power managers that are on or off the integrated circuit 110 or integrated with a CPU.

The action is any instruction, message, process, function, signal, or variable that controls power consumption in the power island 112, 114, 116, and 118. Some examples of actions are clock gating and dynamic clock selection. Another example of an action is modifying a clock frequency of one of the power islands 112, 114, 116, and 118. Another example of an action is to modify voltage of one of the power islands 112, 114, 116, and 118 such as dynamic voltage source, Vdd, selection. Another example of an action is to control dynamic leakage by controlling variable Vt transistors.

Figure 2:
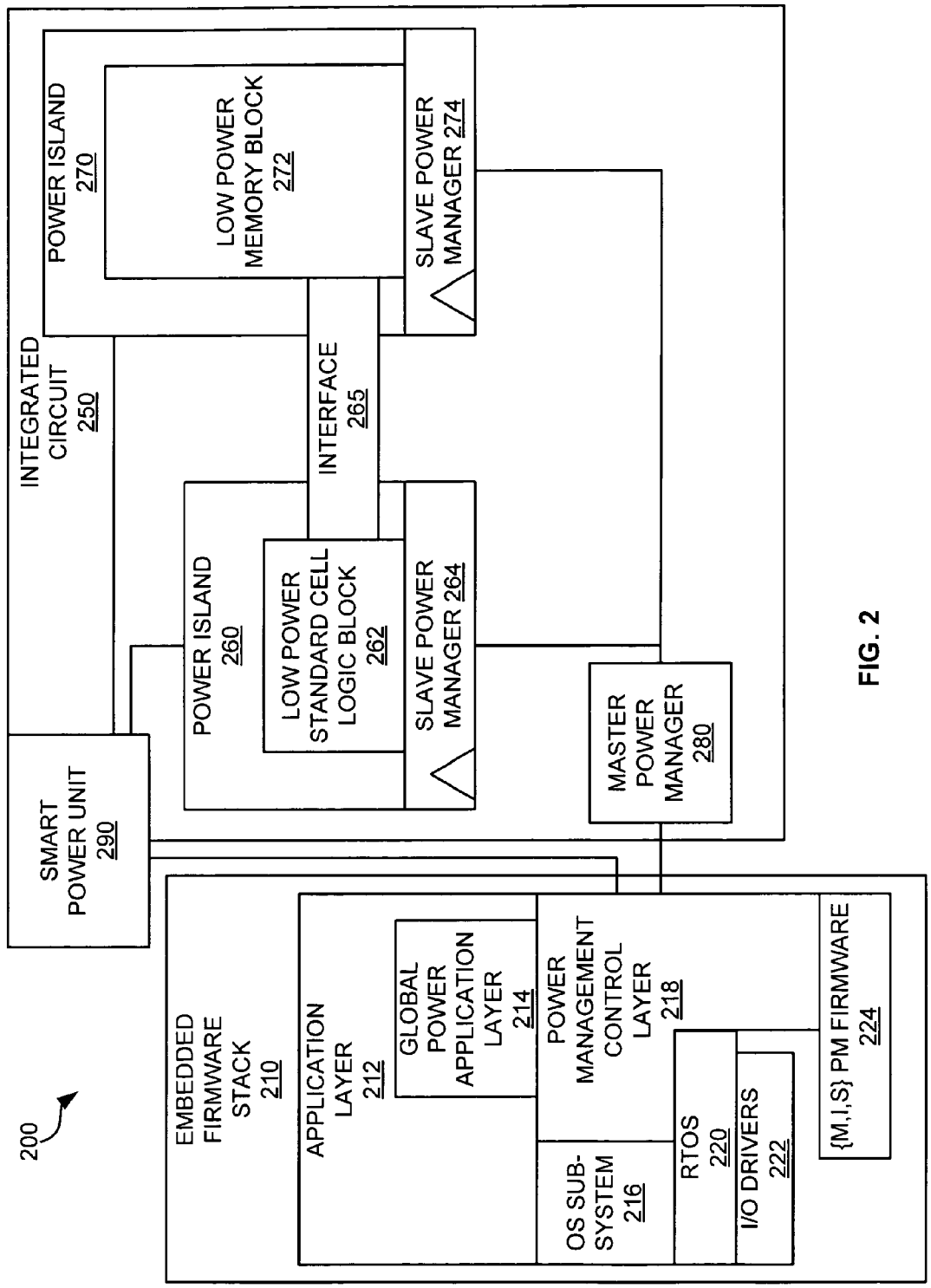
FIG. 2 is a diagram of a system for managing power in an integrated circuit in an exemplary implementation of the invention.

FIG. 2 depicts a diagram of a system 200 for managing power in an integrated circuit 250 in an exemplary implementation of the invention. The system 200 includes an embedded firmware stack 210 and an integrated circuit 250. The embedded firmware stack 210 includes software layers that run on a central processing unit (CPU). In some embodiments, the embedded firmware stack 210 may include an application layer 212, an operating system (OS) sub-system 216, a power management control layer (PMCL) 218, a real-time operating system (RTOS) 220, I/O drivers 222, and power manager (PM) firmware 224 for the MPM, IPM and/or SPM.

The integrated circuit 250 includes a power island 260, a power island 270, and a MPM 280. The power island 260 includes a low power standard cell logic block 262 and a SPM 264. The power island 270 includes a low power memory block 272 and a SPM 274. The low power standard cell logic block 262 and the low power memory block are coupled to an interface 265. The MPM 280 is coupled to the PMCL 218, the SPM 264, and the SPM 274.

In some embodiments, the application layer 212 includes a global power application layer (GPAL) 214. This GPAL 214 may be useful for more complex applications. If the GPAL 214 is present, then all calls to the PMCL 218 application program interfaces (API) are first directed to the GPAL 214. Both the GPAL 214 and the PMCL 218 provide power management for the integrated circuit 250. In some embodiments, the GPAL 214 and/or the PMCL 218 monitor what load is on each power island 260 and 270. Also, the GPAL 214 and/or the PMCL 218 may build a history of power levels on the power island 260 and 270 and store the history data in a database. The GPAL 214 and the PMCL 218 may also provide data for on-demand resources interested in the power levels of the power islands 260 and 270.

In some embodiments when the GPAL 214 is present, the GPAL 214 provides guidance to the PMCL 218 in making local decisions for power management of the integrated circuit 250. In some embodiments, the GPAL 214 and the PMCL 218 include complex algorithms for a static schedule. The GPAL 214 and the PMCL 218 provide the facility for use code to interact and control power behavior and parameters including providing a database and statistics.

The PMCL 218 also collects information from the MPM 280 and provides commands to the MPM 280 for possible IPMs, SPMs 264 and 274, and the power islands 260 and 270. Some of the commands may be to power on/off, change the power level, or change the frequency of the power islands 260 and 270. In some embodiments with a smart power unit (SPU) 290, the GPAL 214 and the PMCL 218 are responsible for communication with the SPU 290 to implement a power policy and collect information on the actual power supply. The SPU 290 is described in further detail below in FIGS. 6-8. In some embodiments, the GPAL 214 and the PMCL 218 provides sockets for existing power management techniques.

The power manager firmware 224 is firmware executed by the master power manager 280, the intermediate power manager, and the slave power managers 264 and 274.

The MPM 280 is any circuitry configured to control the "global" power behavior of the entire integrated circuit 250. In some embodiments, there are multiple MPMs 280 that control the power behavior of the entire integrated circuit 250. In some embodiments, the MPM 280 communicates with existing IPMs and SPMs 264 and 274 to control power within the power islands 260 and 270. The MPM 280 may receive status information about the power islands 260 and 270 from the SPMs 264 and 274 and the IPMs. The MPM 280 may also determine power trade-offs between the IPMs and the SPMs 264 and 274.

The MPM 280 may also provide a main interface to the PMCL 218 firmware. In some embodiments, the MPM 280 communicates with the PMCL 218 to accept commands (e.g. memory mapped commands) and provide status information about the power within the integrated circuit 250. In some embodiments, the MPM 280 communicates with the PMCL 218 through the main bus for the integrated circuit 250. The MPM 280 may also register each of the SPMs 264 and 274 and IPMs and capabilities with the PMCL 218. Some operations of the MPM 280 are described in further detail below in FIGS. 5, 8, 9, and 11. In some embodiments, the MPM 280 reads and writes scan chains for state save and restore along with the local logic analyzer ability.

Some embodiments may include an IPM (not shown) that coordinates SPMs 264 and 274 on behalf of the MPM 280. In some embodiments, the IPM controls and coordinates power behavior on portions of the area controlled by the MPM 280. In some embodiments, the IPM controls the SPMs 264 and 274 that are on a separate chip from the MPM 280.

The SPM 264 is any circuitry configured to control power within a power island 264 in the integrated circuit 250. One example of the SPM 264 is an IP block that controls power within a power island 264 in the integrated circuit 250. The SPM 264 may include signal buffering, level shifting, and signal isolation. In some embodiments, the SPM 264 is integrated into scan chains to provide easier implementation and integration. Also, in some embodiments, the SPM 264 has a very small "footprint" with a low gate count and low power. In some embodiments, the SPM 264 comprises a command interface to communicate status information, service requests, and commands. Some of the commands are load, sleep, and idle. The SPM 264 may also recognize its own address to allow for multi-drop bussing.

In some embodiments, the SPM 264 has registration capabilities. For registration at power-up, the SPM 264 uses call-back registration that is typically used for off chip SPMs and IPMs. For static registration when the integrated circuit is generated for on chip SPMs, the SPM 264 registers what the SPM 264 can do, what the IPM can do, and the type of commands that the SPM 264 or IPM can service. The SPM 264 may also have save and restore functions for power off periods. The SPM 264 may have watch-dog timer(s). In some embodiments, the SPM 264 has a debug interface coordination to the power island 260. The SPM 264 may also monitor local state and collect information for components within the power island 260. The SPM 264 may also locally control Vdd, clocks for frequency selection, and dynamic back biasing. The description for the SPM 264 also applies to the SPM 274 for the power island 270.

In some embodiments, the SPM 264 checks whether an event occurs when the collected information from the power island 260 crosses a threshold or exceeds a range. In some embodiments, the SPM 264, IPMs, or the MPM 280 monitors power consumption levels of the power island 260 to check whether the power consumption levels cross a threshold level or exceed a range. A power consumption level is any information, data, or statistic that indicate the power consumed in a power island 260. Some examples of power consumption levels are temperature and power. The threshold or range may be programmable. The SPM 264 may report the event asynchronously, or another element such as the MPM 280 may solicit whether an event has occurred. The event may also be a multi-level test such as the conditions occur at a greater than a given, programmable frequency or exceed a given, programmable duration.

Figure 3:
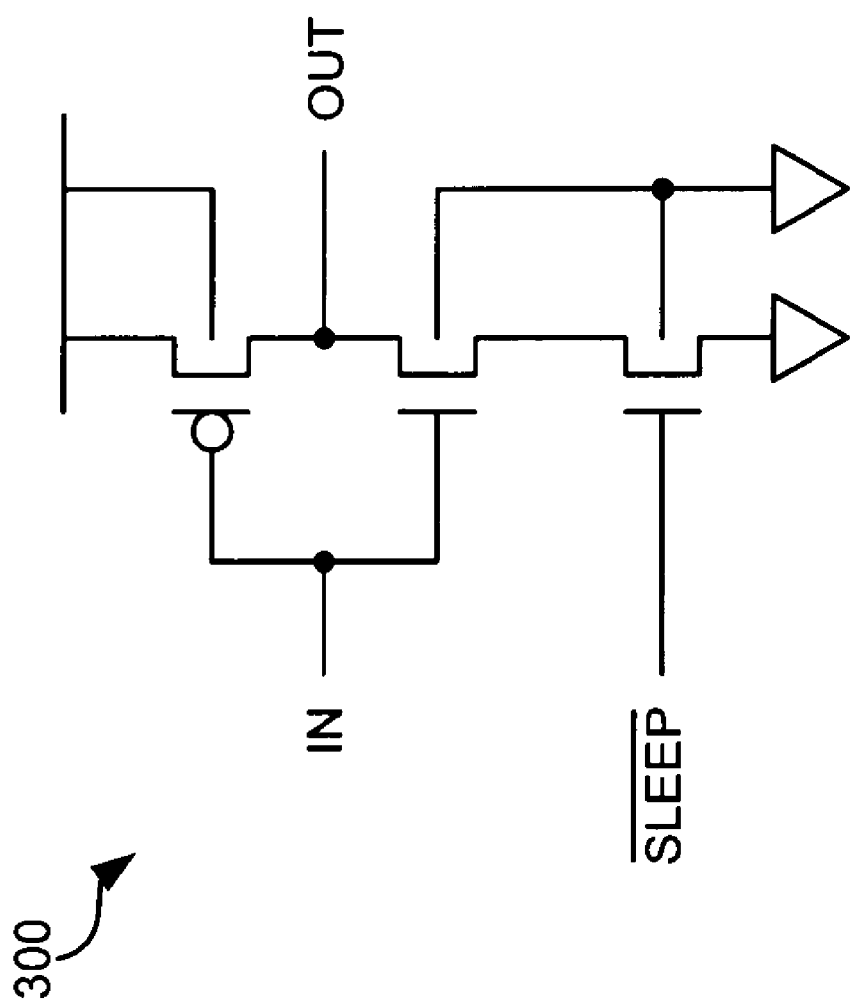
FIG. 3 is an illustration for low leakage circuitry for a low power standard cell logic block in an exemplary implementation of the invention.

In some embodiments, the low power standard cell logic block 262 one example of a standard cell library that may be included in the power island 260. In some embodiments, the standard cell library is optimized for lower power. The standard cell library may be characterized over a range of operating voltages. In some embodiments, the standard cell library includes synchronous circuits and/or asynchronous circuits. In some embodiments, the standard cell library includes static circuits and/or encapsulated, dynamic logic circuits. The standard cell library may also include multiple voltage domain interface circuits such as level shifters and signal isolation circuits. The standard cell library may also have a multi-threshold design and characterization such as standard Vt, high Vt, low Vt, and variable Vt circuits. The standard cell library may also include data retention (shadow) circuits and anti-glitch circuits. The standard cell library may also include low leakage "sleep" circuits. FIG. 3 depicts an illustration of low leakage circuitry 300 for the low power standard cell logic block 262 in an exemplary implementation of the invention.

Figure 4:
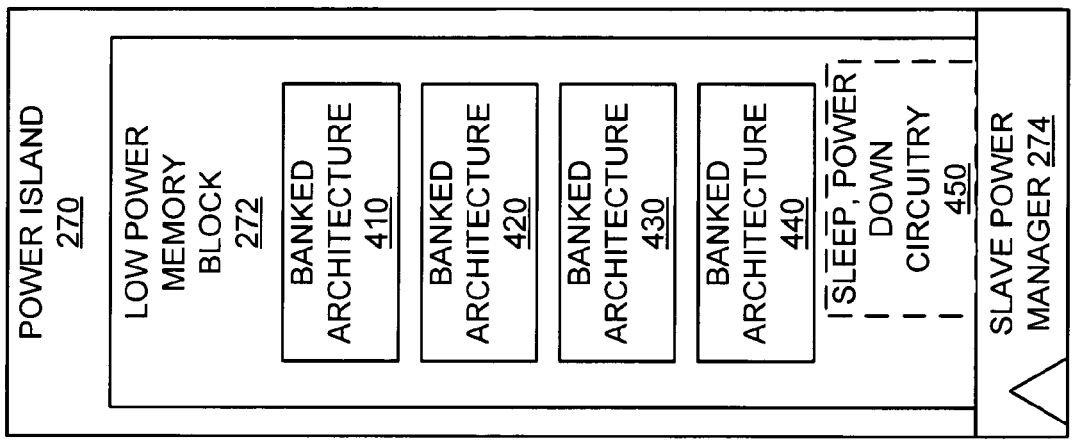
FIG. 4 is a diagram of a power island in an exemplary implementation of the invention.

FIG. 4 depicts a diagram of the power island 270 in an exemplary implementation of the invention. The power island 270 includes a low power memory block 272 and the SPM 274. The low power memory block 272 includes banked architectures 410, 420, 430, and 440 for memories and sleep, power down circuitry 450. In some embodiments, the memory in the power island 270 is RAM and/or ROM. Some examples of the RAM are the SRAM compilers such as single-port, 2-port, and dual-port. Some examples of the ROM are ROM compilers. Some memories in the power island 270 are optimized for low power such as the low power memory block 272. In one embodiment, the low power memory block 272 includes multiple bank architectures via the compiler such as banked architectures 410, 420, 430, and 440. The memories in the power island 270 may also include sleep, power down circuitry 450 for low power modes such as sleep, nap, and full power down. The memories in the power island 270 may also include programmable read/write ports. The memories in the power island 270 may also be an asynchronous and/or synchronous design.

In some embodiments, the system 200 also includes a smart power unit (SPU) 290. In some embodiments, the SPU 290 is off-chip to the integrated circuit 250. The SPU 290 is an external unit configured to control power and clock distribution to the integrated circuit. The circuitry of the SPU is described in further detail below in FIGS. 7 and 8.

Figure 5:
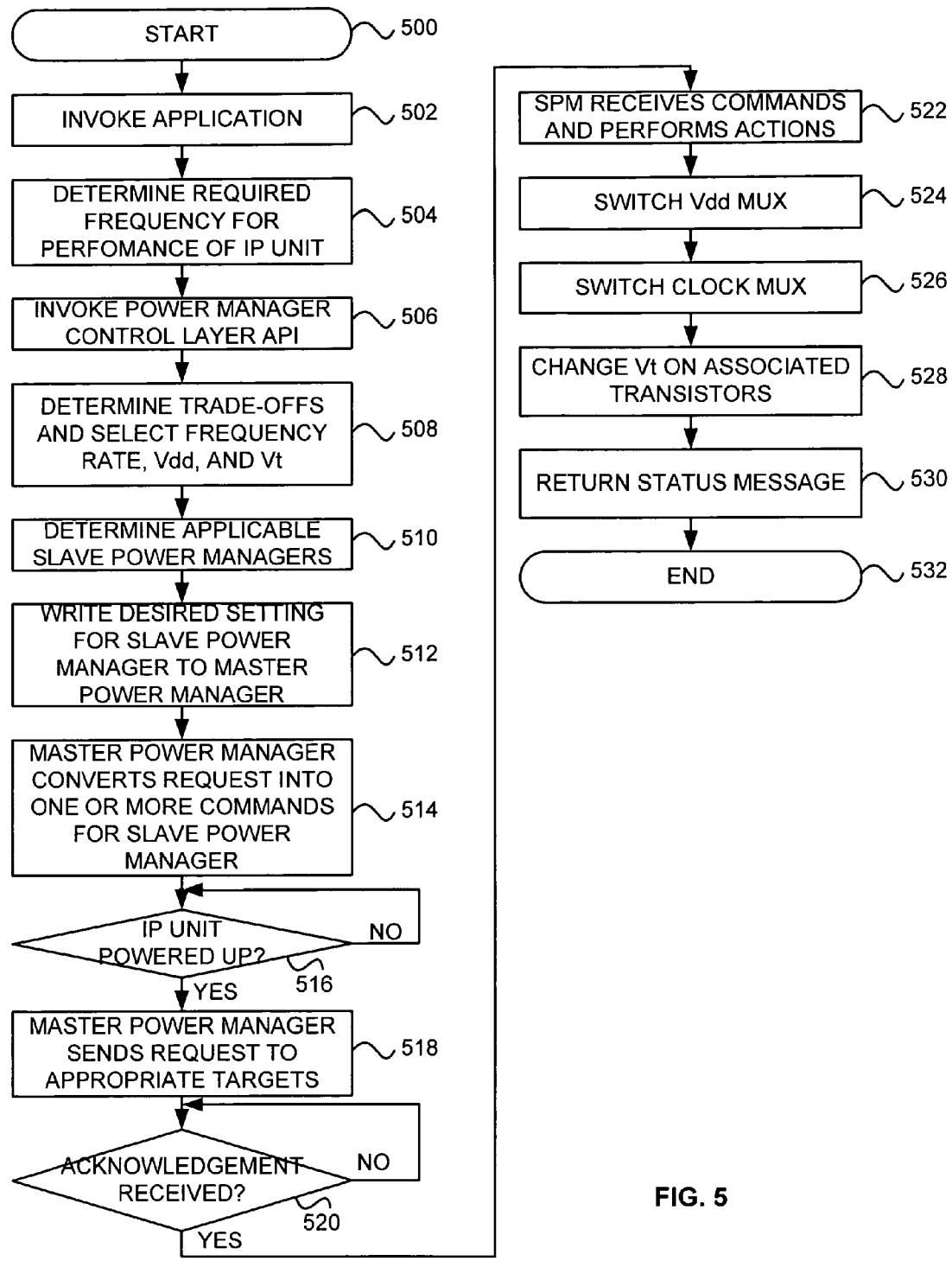
FIG. 5 is a flowchart from an application request to a slave power manager action in an exemplary implementation of the invention.

FIG. 5 depicts a flowchart from an application request to an SPM action in an exemplary implementation of the invention. FIG. 5 begins in step 500. In step 502, an application is invoked such as playing a movie. In step 504, the application determines the required frequency for performance of an IP unit. For example, the application determines a specified frequency in MHz for IP unit for an MPEG decoder. In some embodiments, when the IP unit is totally asynchronous, the required frequency will be an artificial measure of performance. In some embodiments that have multiple clocks involved, the minimum performance for each clock is specified.

In step 506, the application invokes the PMCL 218 API call. One example of this call is "Set_Rate (unit Y, N MHz, degree of dynamic power management (DPM) allowed, DPM threshold, other information to allow DPM trade-offs, starting back bias for SPMs with dynamic bias, wait for power up flag)." In this example, the other information could be "no power off, use high Vt and clocks off instead" and "major waits are about 10 us, with a 400 ns threshold." In some embodiments with multiple clocks, the PMCL 218 API call allows the application to specify all required frequencies.

The PMCL 218 determines possible trade-offs available for the unit and selects a frequency rate, Vdd, and Vt if applicable for the unit that best meets the given requirements in step 508 and determines the applicable SPMs 264 and 274 in step 510. In some embodiments, the MPM 280 or IPM performs steps 508 and 510. In some embodiments for multiple clocks, the Vdd and Vt specified would allow for all specified clocks to meet or exceed their required frequencies.

In step 512, the PMCL 218 then writes the desired setting for the SPMs 264 and 274 to the MPM 280 (or IPM). In step 514, the MPM 280 (or IPM) converts the request into one or more commands for the SPMs 264 and 274 (or IPM) associated with the unit.

In step 516, if the application sets the wait for power up flag, the PMCL 218 then waits until the IP unit is fully powered up before returning from the call. Otherwise, the call returns as soon as the command is acknowledged, with status of 0 for okay, 1 for fast power-up, 2 for slow power-up, or 3+ for error conditions. The powered up state is when the unit is at the desired Vdd for the requested frequency, and not just that the unit is turned on.

In step 518, the MPM 280 (or IPM) sends the requests to the appropriate targets. In step 520, the MPM 280 waits for the receipt of the acknowledgements that indicate message received and executed or execution has begun. A NACK or negative acknowledgement may also be returned from the SPM 264 and 274.

In step 522, the SPM 264 receives the commands and performs the actions. Steps 524-528 are possible actions that the SPM 264 may perform. In step 524, the SPM 264 switches the Vdd mux. In step 526, the SPM 264 switches a clock mux. In some embodiments when the voltage goes down, step 526 is performed before step 524. In step 528, the SPM 264 changes the Vt on the associated transistors. After the SPM 264 performs the actions, the SPM 264 returns a status message upstream indicating acknowledgement or negative acknowledgement in step 530. FIG. 5 ends in step 532.

Figure 6:
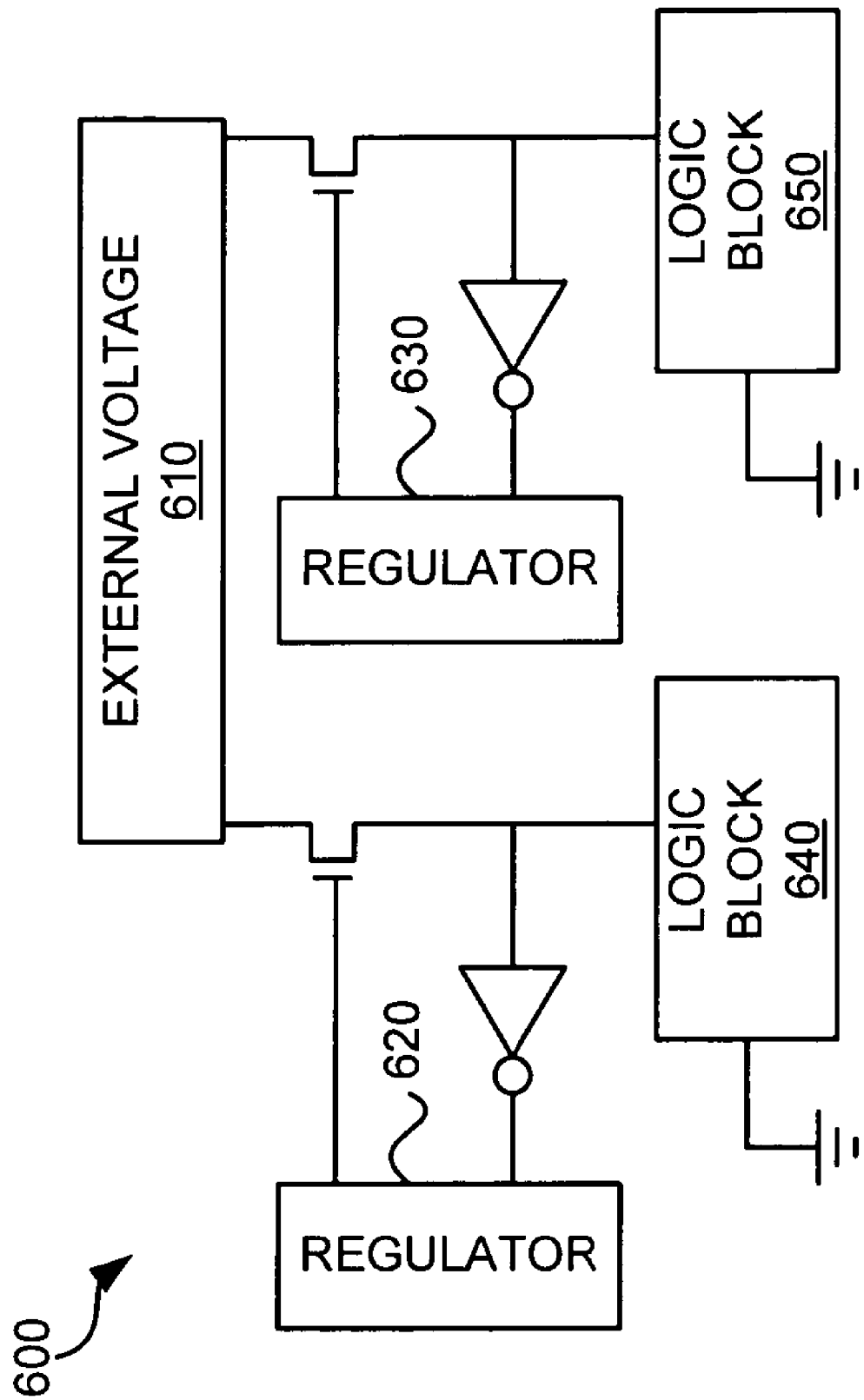
FIG. 6 is an illustration of internal circuitry for a smart power unit in an exemplary implementation of the invention.

FIG. 6 depicts an illustration of internal circuitry 600 for an SPU 290 in an exemplary implementation of the invention. In this embodiment, the internal circuitry 600 for the SPU 290 is internal to the integrated circuit 250 of FIG. 2. The internal circuitry 600 includes an external voltage 610, a dropout voltage regulator 620, a dropout voltage regulator 630, a logic block 640, and a logic block 650.

Figure 7:
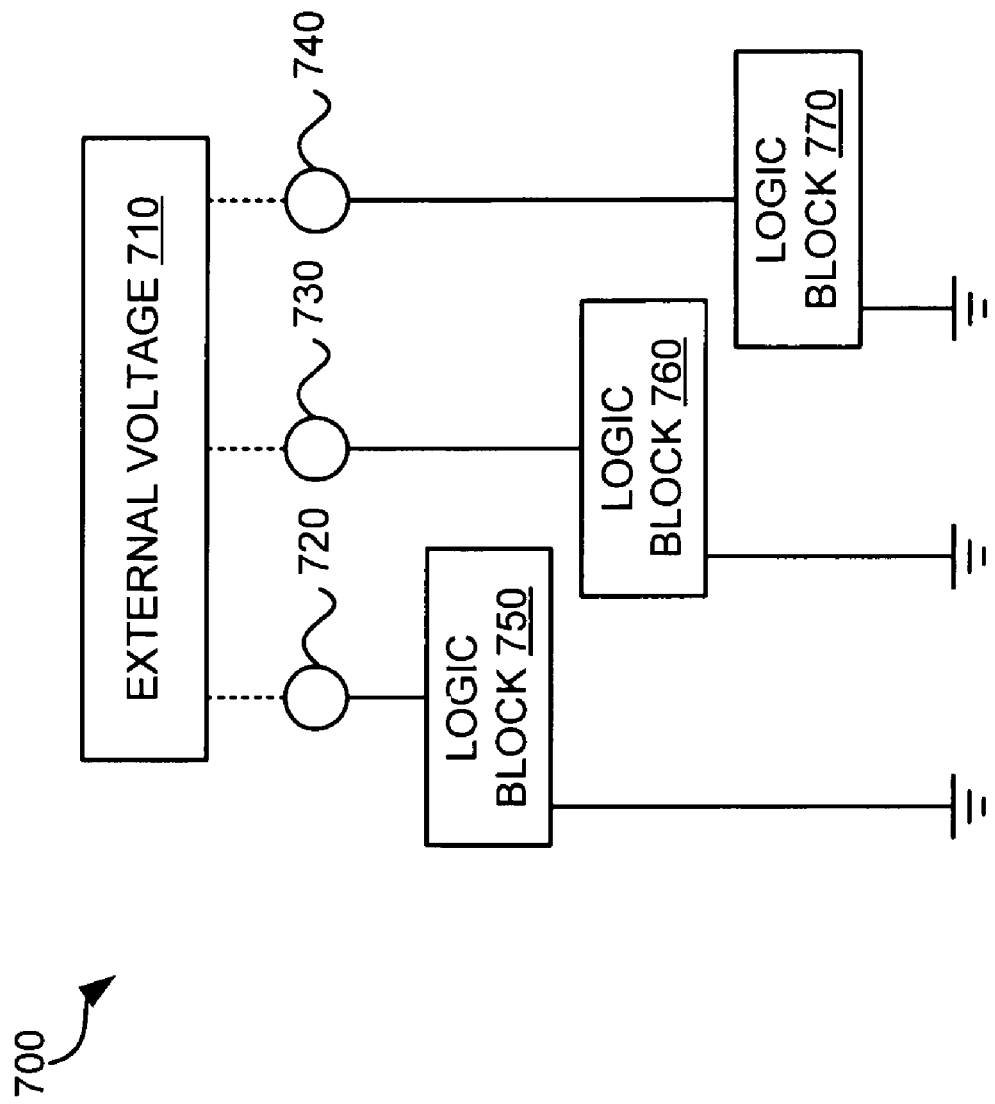
FIG. 7 is an illustration of external circuitry for a smart power unit in an exemplary implementation of the invention.

FIG. 7 depicts an illustration of external circuitry 700 for an SPU 290 in an exemplary implementation of the invention. In this embodiment, the external circuitry 700 for the SPU 290 is external to the integrated circuit 250 of FIG. 2. The internal circuitry 700 includes an external voltage 710, a power supply pin 720, a power supply pin 730, a power supply pin 740, a logic block 750, a logic block 760, and a logic block 770. The external circuitry 700 for the SPU 290 provides a DC/DC conversion. The DC/DC conversion provides multiple independent power supply pins 720, 730, and 740. The power supply pins 720, 730, and 740 have a variable voltage supply on each separate power pin. Also, in some embodiments, the variable voltage is within a range and in steps. In some embodiments, the PMCL 218 controls the voltage to power supply pins 720, 730, and 740.

Figure 8:
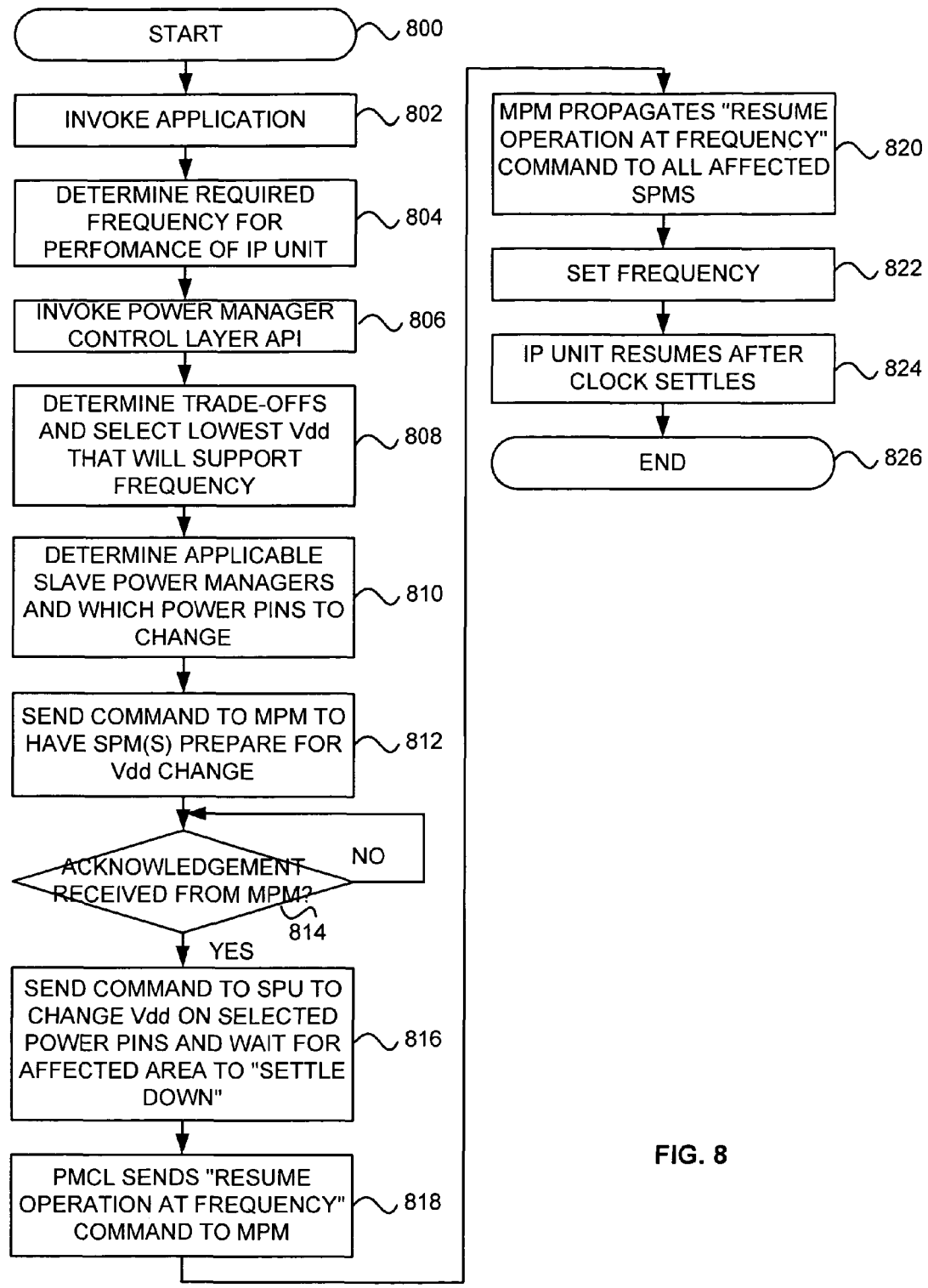
FIG. 8 is a flowchart from an application request to a smart power unit action in an exemplary implementation of the invention.

FIG. 8 depicts a flowchart from an application request to an SPU action in an exemplary implementation of the invention. FIG. 8 begins in step 800. In step 802, an application is invoked. In step 804, the application determines the required frequency for performance of an IP unit. For example, the application determines a specified frequency in MHz for IP unit for an MPEG decoder.

In step 806, the application invokes the PMCL 218 API call. One example of this call is "Set_Rate (unit Y, N MHz, degree of dynamic power management (DPM) allowed, DPM threshold, other information to allow DPM trade-offs, starting back bias for SPMs with dynamic bias, wait for power up flag)." In this example, the other information could be "no power off, use high Vt and clocks off instead" and "major waits are about 10 us, with a 400 ns threshold."

The PMCL 218 determines possible trade-offs available for the unit and selects a the lowest possible Vdd that will support the requested frequency in step 808 and determines the SPMs 264 and 274 that will be affected and which power PINs to change in step 810.

In step 812, the PMCL 218 sends a command to the MPM 280 to have the SPMs 264 and 274 (and IPM) to prepare for a Vdd change. In step 814, the PMCL 218 waits for the acknowledgement from the MPM 280. In step 816, the PMCL 218 sends a command to the SPU 290 to change the Vdd on the selected power pins and waits for the affected area to "settle down." In step 818, the PMCL 218 then sends a "resume operation at a specified frequency" command to the MPM 280. In step 820, the MPM 280 propagates the resume command to all affected SPMs 264 and 274 (and IPMs). In step 822, one of the power managers (i.e. MPM 280, IPM, or SPMs 264 and 274) sets the specified frequency. In step 824, the IP unit operation resumes after the clock has settled. FIG. 8 ends in step 826. In some embodiments, the user application has the option of waiting for the entire operation to finish or to continue and either query the PMCL 218 as to the progress of the operation or wait for a "finished" interrupt from the PMCL 218.

Figure 9:
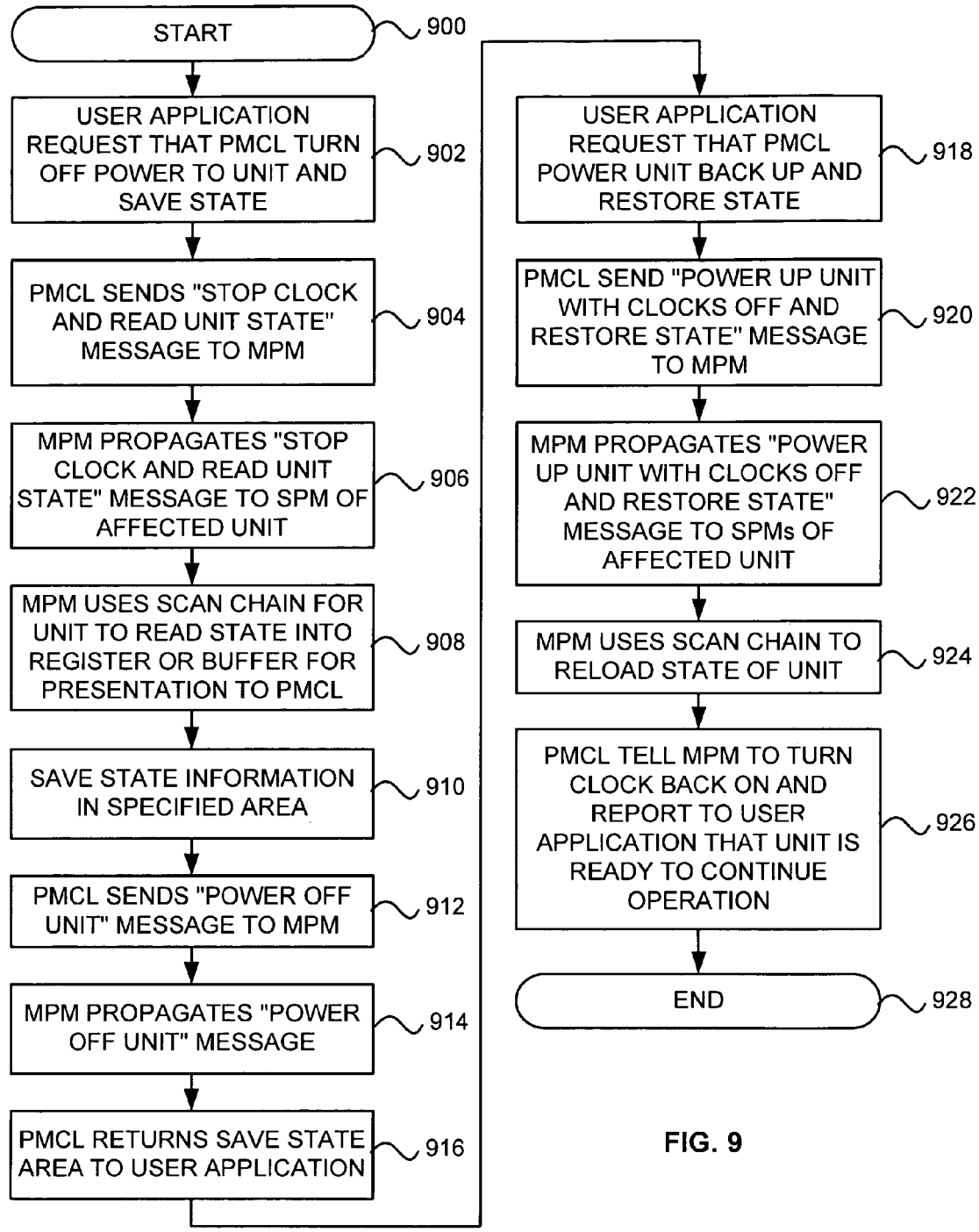
FIG. 9 is a flowchart for saving an IP unit's state prior to powering down and restoring the IP unit's state when powering up in an exemplary implementation of the invention.

FIG. 9 depicts a flowchart for saving an IP unit's state prior to powering down and restoring the IP unit's state when powering up in an exemplary implementation of the invention. FIG. 9 begins in step 900. In step 902, the user application requests that the PMCL 218 power off an IP unit and wants to save the IP unit's state. In some embodiments, the reconfiguration of the IP unit takes a long time. The request in step 902 may be accompanied by the address of an area to which the state should be saved.

In step 904, the PMCL 218 sends a "stop clock and read IP unit state" message to the MPM 280. The MPM 280 then propagates the "stop clock and read IP unit state" message to the SPMs 264 and 274 of the affected unit in step 906. In step 908, the MPM 280 uses the scan chain for the IP unit to read the state into a register or buffer for presentation to the PMCL 218. In step 910, if the PMCL 218 provided the MPM 280 with the address of the save area, the MPM 280 saves the state information directly in the specified area. In step 912, after all of the IP units' state has been saved, the PMCL 218 sends a "power off IP unit" message to the MPM 280. In step 914, the MPM 280 then propagates out the "power off IP unit" message. In step 916, the PMCL 218 returns the save state area to the user application. The save state area contains the state of the unit.

At a later time, in step 918, the user application requests that the PMCL 218 power the IP unit back up and restore the state of the IP unit. In some embodiments, the user application request includes the address of the area to which the state was saved. In step 920, the PMCL 218 sends a "power up IP unit with clocks off and restore state" message to the MPM 280. In step 922, the MPM 280 propagates the "power up IP unit with clocks off and restore state" message to the SPMs 264 and 274 of the affected IP unit. In step 924, after the IP unit is powered up, the MPM 280 uses the scan chain to reload the unit's state. In some embodiments, the reloading of the unit's state originates directly from the save area or from information passed to the MPM 280 from the PMCL 218. In step 926, the PMCL 218 sends a message to the MPM 280 to turn clock back on and report to user application that the IP unit is ready to continue operations. FIG. 9 ends in step 928.

In some embodiments, the same functionality of FIG. 9 can be used to implement an internal "logic analyzer" function, in which the IP unit in question would not be powered down after being read. If the associated SPMs 264 and 274 of the IP unit have the ability to single- or multi-step the clock, the local scan testing is performed by having the SPMs 264 and 274 "signal isolate" the IP unit. Then, use of a combination of the ability of single- or multi-step the clock and the ability to use the scan chain can read/write the IP unit's internal state.

Figure 10:
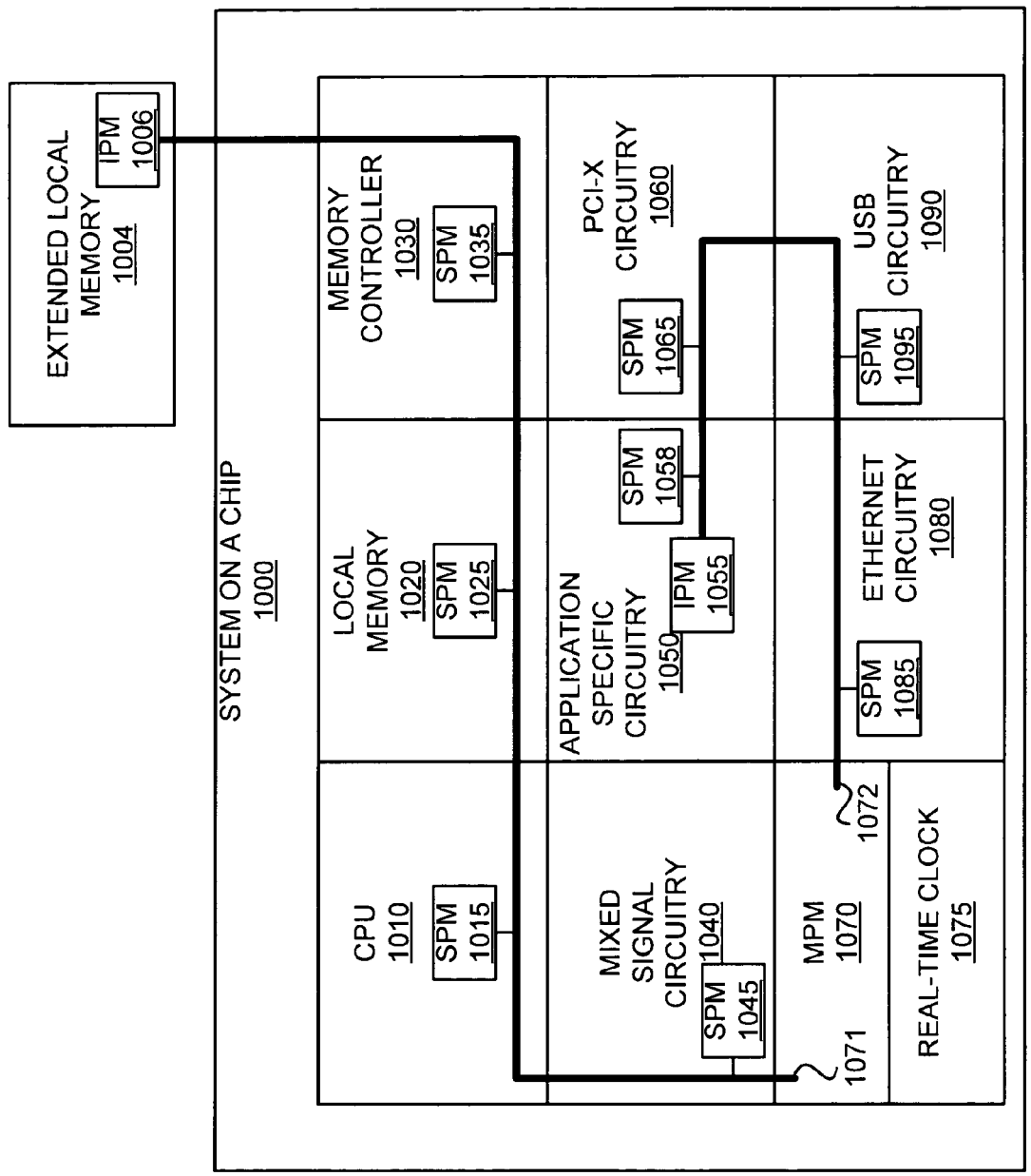
FIG. 10 is diagram of a system on a chip and an extended local memory in an exemplary implementation of the invention.

FIG. 10 depicts a diagram of a system-on-a-chip (SOC) 1000 and an extended local memory 1004 in an exemplary implementation of the invention. The SOC 1000 is one example of the integrated circuit 250 and communicates with the embedded firmware stack 210 in FIG. 2 as described above. The SOC 1000 includes a CPU 1010, a local memory 1020, a memory controller 1030, a mixed signal circuitry 1040, an application specific circuitry 1050, a PCI-X circuitry 1060, a MPM 1070, a real-time clock (RTC) 1075, an Ethernet circuitry 1080, and a USB circuitry 1090. The CPU 1010, the local memory 1020, the memory controller 1030, the mixed signal circuitry 1040, the application specific circuitry 1050, the PCI-X circuitry 1060, the Ethernet circuitry 1080, and the USB circuitry 1090 are all power islands in which power is controlled within the power islands by power managers. In this embodiment, the power islands are delineated by the functionality of a part of the SOC 1000.

The extended local memory 1004 includes an IPM 1006 that is coupled to the bus 1071. The CPU 1010 includes an SPM 1015 that is coupled to the bus 1071. The local memory 1020 includes an SPM 1025 that is also coupled to the bus 1071. The memory controller 1030 comprises an SPM 1035 that is coupled to the bus 1071. The mixed signal circuitry 1040 includes an SPM 1045 that is coupled to the bus 1071. The application specific circuitry 1050 includes an IPM 1055 and an SPM 1058 that are both coupled to the bus 1072. The PCI-X circuitry 1060 includes an SPM 1065 that is coupled to the bus 1072. The MPM 1070 is coupled to the bus 1071 and the bus 1072. The MPM 1070 is one example of the MPM 280 as described above. The Ethernet circuitry 1080 includes an SPM 1085 that is coupled to the bus 1072. The USB circuitry 1090 includes an SPM 1095 that is coupled to the bus 1072.

In this embodiment, power command buses comprise the bus 1071 and the bus 1072. The bus 1071 and 1072 are simple multi-drop serial buses that may cross chip boundaries and interconnect power managers. The power command bus may be a combination of serial busses, such as the bus 1071 and the bus 1072, with one per region of the chip and then multi-drop within the region. In other embodiments, the power command bus includes a parallel bus or a combination of serial and parallel busses. In some embodiments, the power command bus is the system bus. The power command bus may contain messages with at least a unit ID with the associated payload. For a fixed point to point bus, the message does not need a unit ID only the payload.

In some embodiments, the power command bus uses an error detection scheme such as parity, ECC, or a redundant code. In some embodiments, the power command bus is a low performance bus that does not interfere with the integrated circuit design and is not visible to the user. In some embodiments, the communication between the PMCL 218 and the MPM 1070 is memory mapped and based on the main bus such as an AHB for an SOC 1000.

Some embodiments may include a separate bus for reporting status information between the power managers. In one example, this separate bus provides asynchronous "Alert" type status messages from SPMs to the MPM.

There can be various message formats for the power command bus. In one example for a basic format, the message format includes a start of message indicator, a power manager address, type code, basic command, and an end of message indicator. In one example for an extended format, the message format includes the basic format, an additional length, and additional information. In one example for a response message format, the message format includes a start of message reply indictor, a power manager address, a 3b ACK or NAK or return status (implied ACK), a payload length for return status messages, a payload for return status messages, a reason code for NAK, and an end of message indicator.

In some embodiments, the SPM 1015 or the IPM 1006 times out on replying to a command, and the MPM 1070 reissues the command a programmable number of times. If the SPM 1015 or the IPM 1006 still fails, the MPM 1070 marks the SPM 1015 or the IPM 1006 as unusable and reports back the failure to the PMCL 218. In one embodiment, the PMCL 218 has the MPM 1070 reinitialize the failing SPM 1015 or the IPM 1006 via the scan system and then retries sending the message. Other conditions such as invalid responses to commands or invalid status reports are also handled by the re-initialization. In some embodiments, the state of the failing SPM 1015 or the IPM 1006 may be read out and saved for later analysis.

Figure 11:
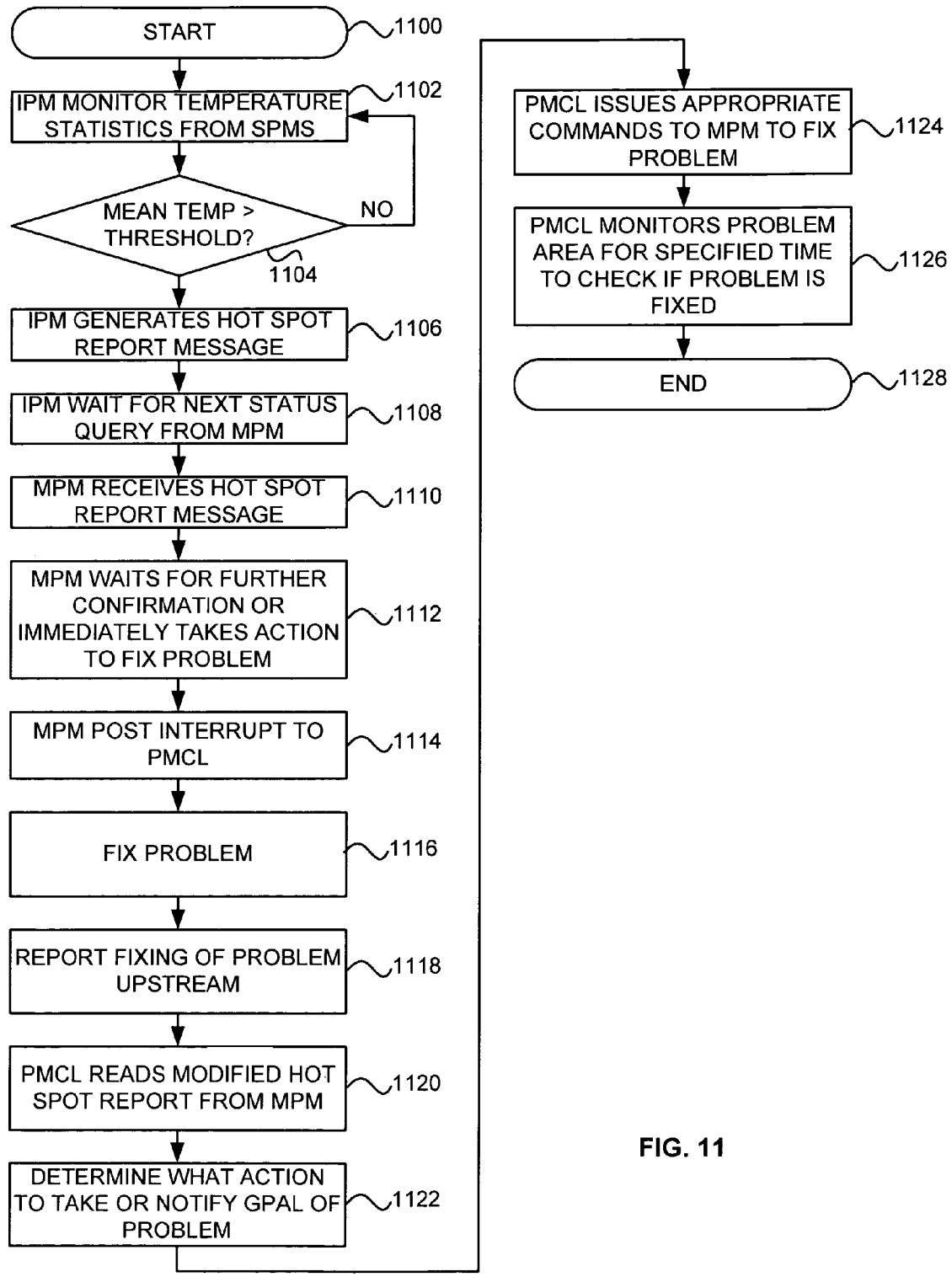
FIG. 11 is a flowchart for generating a "hot spot" report from an intermediate power manager to a power management control layer in an exemplary implementation of the invention.

FIG. 11 depicts a flowchart for generating a "hot spot" report from an IPM 1055 to the PMCL 218 in an exemplary implementation of the invention. FIG. 11 begins in step 1100. In step 1102, the IPM 1055 monitors the temperature statistics of the SPMs. In step 1104, the IPM 1055 checks whether the mean temperature has exceeded a predetermined and programmed threshold. If the mean temperature has not exceeded the threshold, the IPM 1055 returns to step 1102 to keep monitoring. If the mean temperature has exceeded the threshold, the IPM 1055 then generates a problem ("hot spot") report message in step 1106. In step 1108, the IPM 1055 waits for the next status query the MPM 1070. In some embodiments, a logically separate bus is provided for asynchronous status reports to the MPM 280.

In step 1110, the MPM 1070 receives the hot spot report message. In step 1112, the MPM 1070 either waits for further confirmation (i.e. see that the "hot spot" last pasts a predetermined threshold) or immediately takes action to fix the problem depending on the internal logic of the MPM 1070. In some embodiments, in step 1114, the MPM 1070 takes action by posting an interrupt to the PMCL 280 that it needs attention. In other embodiments, if the PMCL 280 queries the MPM 1070 often enough, then the interrupt is not needed. In step 1116, the MPM 1070 (or IPM) fixes the problem by making a local trade-off, performing the action, or ordering the action to be performed. One example of fixing the problem is lowering the operating frequency of the hot spot area. In step 1118, the MPM 1070 reports both the problem and the fixing of the problem upstream.

In step 1120, the PMCL 218 reads the modified hot spot report from the MPM 1070. In step 1122, the PMCL 218 determines what action to take to fix the problem or notify the GPAL 214 of the problem. In step 1124, the PMCL 218 issues the appropriate commands to the MPM 1070 to fix the problem. In this step, the software will make the trade-off required to fix the problem. In some embodiments, if the GPAL 214 determines the high level fix, then the GPAL 214 sends it to the PMCL 280 to be converted into MPM commands. In step 1126, the PMCL 218 monitors the problem area for a specified time to check if the problem is fixed. FIG. 11 ends in step 1128.

In some embodiments, the type of functionality in FIG. 11 can be performed at other levels such as the PMCL 218. In one example, the PMCL 218 queries (via the MPM 1070) all the SPMs that have the desired measurement ability (and IPMs) as to their local conditions and can then, for example, build a "map" of power usage that it can then act on.

Figure 12:
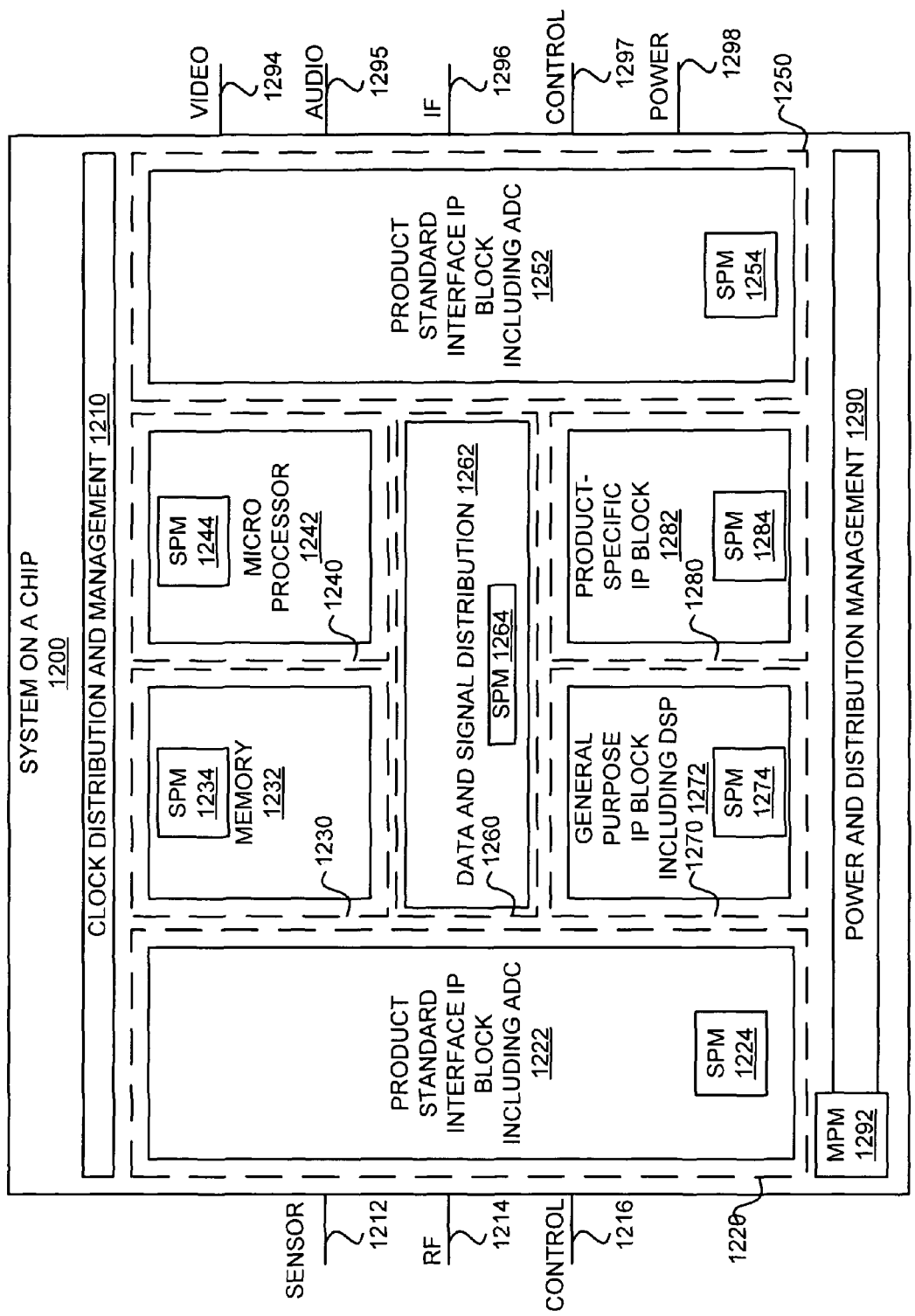
FIG. 12 is a diagram of a system on a chip in an exemplary implementation of the invention.

FIG. 12 depicts a diagram of a system-on-a-chip (SOC) 1200 in another exemplary implementation of the invention.

The SOC 1200 is attached to a sensor link 1212, an RF link 1214, a control link 1216, a video link 1294, an audio link 1295, an interface link 1296, a control link 1297, and a power link 1298. The SOC 1200 includes clock and distribution management 1210, an IP block power island 1220, a memory power island 1230, a microprocessor power island 1240, an IP block power island 1250, a distribution power island 1260, an IP block power island 1270, an IP block power island 1280, and power and distribution management 1290.

The IP block power island 1220 includes a product standard interface IP block including an analog-to-digital converter (ADC) 1222, which includes an SPM 1224. The IP block power island 1230 includes a memory 1232, which includes an SPM 1234. The microprocessor power island 1240 includes a microprocessor 1242, which includes an SPM 1244. The IP block power island 1250 includes a product standard interface IP block including ADC 1252, which includes an SPM 1254. The distribution power island 1260 includes a data and signal distribution 1262, which includes an SPM 1264. The IP block power island 1270 includes a general purpose IP block including a digital signal processor (DSP) 1272, which includes an SPM 1274. The IP block power island 1280 includes a product-specific IP block 1282, which includes an SPM 1284. The power and distribution management 1290 includes an MPM 1292.

Figure 13:
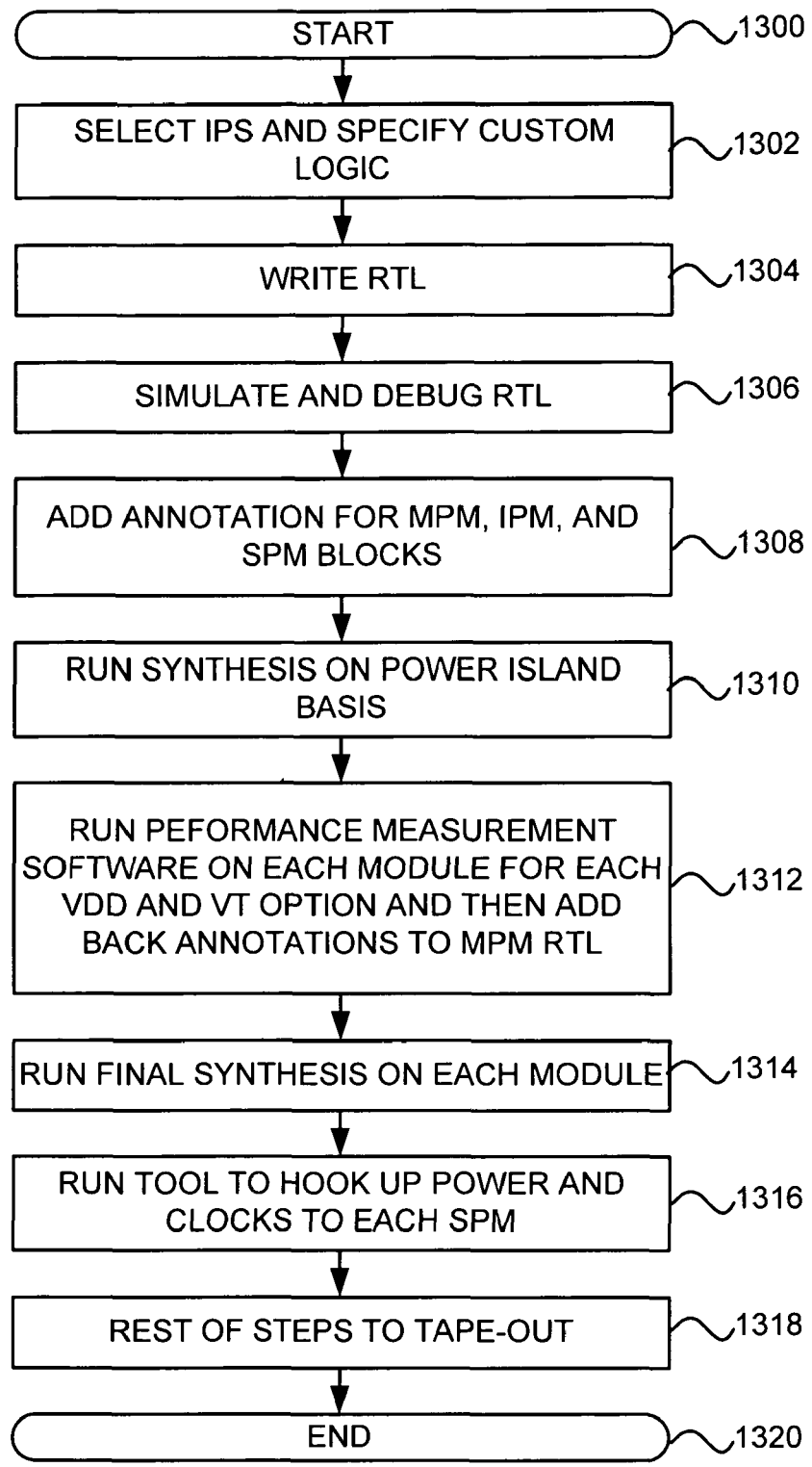
FIG. 13 is a flowchart for building a chip with power islands in an exemplary implementation of the invention.

FIG. 13 depicts a flowchart for building a chip with power islands in an exemplary implementation of the invention. FIG. 13 begins in step 1300. In step 1302, the IPs or library cells are selected, and the custom logic, if any, is specified to be used to build the chip. In some embodiments, the maximum and sub clock rate, % idle time, and minimum and maximum Vdd are specified. In step 1304, the register transfer level (RTL) is written. In step 1306, the RTL is simulated and debugged.

Either during or after the writing of the RTL, a software tool may be used to add annotations for the MPM, IPM, and/or SPM blocks in step 1308. In some embodiments, the desired functionality options are specified in the annotations. In some embodiments, the optional functionality is specified per SPM block. In some embodiments, the RTL is annotated with SPM configuration information on a per-module basis. In some embodiments, the proper annotation is inserted by hand on a per module basis during or after the RTL is written. In other embodiments, a separate table in the proper format is created with the module names and respective annotations. In some embodiments, a separate software tool provides the ability to interactively build the separate table. In some embodiments, the software tool adds the proper annotation to the un-annotated modules in the RTL using information from the table.

In step 1310, the synthesis is run on a power island basis, where power islands are not mixed. In step 1312, performance measurement software is run on each module for each Vdd and Vt option, and then the annotations for the MPM are added to the RTL. In some embodiments, the performance of the design is measured at all desired voltages and Vt combinations. The software tool then derives the actual frequency, Vdd, and Vt tables for each SPM and back annotates the MPM (or IPM) RTL of the SPM characteristics.

In step 1314, the final synthesis is run on a power island basis. In some embodiments, the modules are separately routed or by SPM. In step 1316, the software tool is run to hook up power and clocks to each SPM. Step 1318 is the rest of the steps to tape-out. In some embodiments, the software tool generates the finished net-list with all information. FIG. 13 ends in step 1320.

The above-described elements can be comprised of instructions that are stored on storage media. The instructions can be retrieved and executed by a processor. Some examples of instructions are software, program code, and firmware. Some examples of storage media are memory devices, tape, disks, integrated circuits, and servers. The instructions are operational when executed by the processor to direct the processor to operate in accord with the invention. Those skilled in the art are familiar with instructions, processor, and storage media.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. An integrated circuit comprising:
   an integrated circuit chip;
   a plurality of power islands disposed on the integrated circuit chip having associated power consumptions, each of the power consumptions being independently controllable by changing a supply voltage and operating frequency;
   one or more power consumption signals indicating one or more of the power consumptions;
   a power management processor disposed on the integrated circuit chip and coupled to each of the power islands configured to monitor the one or more power consumption signals, the power management processor being dedicated to execute power management software to individually control each of the power consumptions, and the power management processor being configured to change power consumption in at least one of the power islands in response to a power consumption change request.

2. The integrated circuit as claimed in claim 1 wherein the power management software is embedded firmware in the integrated circuit.

3. The integrated circuit as claimed in claim 2 wherein one or more of the power consumptions is changed by selecting a non-zero supply voltage, stopping a clock and selecting one of plural threshold voltages of variable threshold transistors.

4. The integrated circuit as claimed in claim 2 wherein a first of the power islands is capable of communicating synchronously and asynchronously with a second of the power islands.

5. The integrated circuit as claimed in claim 1 wherein each of the power consumptions is further controlled by stopping a clock.

6. The integrated circuit as claimed in claim 5 wherein stopping the clock comprises clock gating.

7. The integrated circuit as claimed in claim 1 wherein the one or more power consumption signals include temperature or power dissipation measurement.

8. An integrated circuit comprising:
   an integrated circuit chip;
   a plurality of power islands disposed on the integrated circuit chip having associated power consumptions, each of the power consumptions being independently controllable by changing a supply voltage and operating frequency;
   one or more power consumption signals indicating one or more of the power consumptions;
   a power manager disposed on the integrated circuit chip and coupled to each of the power islands configured to monitor the one or more power consumption signals, the power manager being configured to individually control each of the power consumptions, and the power manager being configured to change power consumption in at least one of the power islands in response to a power consumption change request.

9. The integrated circuit as claimed in claim 8 wherein the power manager comprises a processor configured to execute power management software to individually control each of the power consumptions.

10. The integrated circuit as claimed in claim 9 wherein one or more of the power consumptions is changed by selecting a non-zero supply voltage, stopping a clock and selecting one of plural threshold voltages of variable threshold transistors.

11. The integrated circuit as claimed in claim 9 wherein a first of the power islands is capable of communicating synchronously and asynchronously with a second of the power islands.

12. The integrated circuit as claimed in claim 8 wherein the power manager comprises a master power manager and a slave power manager associated with each of the power islands.

13. The integrated circuit as claimed in claim 8 wherein each of the power consumptions is further controlled by stopping a clock.

14. The integrated circuit as claimed in claim 13 wherein stopping the clock comprises clock gating.

15. The integrated circuit as claimed in claim 8 wherein the one or more power consumption signals include temperature or power dissipation measurement.

16. An integrated circuit comprising:
   an integrated circuit chip;
   a plurality of power islands disposed on the integrated circuit chip having associated power consumptions, each of the power islands having a power consumption signal indicating a respective one of the power consumptions, each of the power consumptions being independently controllable by changing a supply voltage and operating frequency;
   a power management processor disposed on the integrated circuit chip and coupled to each of the power islands and configured to monitor the power consumption signals, the power management processor being dedicated to execute power management software to individually control each of the power consumptions, and the power management processor being configured to change power consumption in at least one of the power islands in response to a power consumption change request.

17. The integrated circuit as claimed in claim 16 wherein the power management software is embedded firmware in the integrated circuit.

18. The integrated circuit as claimed in claim 17 wherein one or more of the power consumptions is changed by selecting a non-zero supply voltage, stopping a clock and selecting one of plural threshold voltages of variable threshold transistors.

19. The integrated circuit as claimed in claim 17 wherein a first of the power islands is capable of communicating synchronously and asynchronously with a second of the power islands.

20. The integrated circuit as claimed in claim 16 wherein each of the power consumptions is further controlled by stopping a clock.

21. The integrated circuit as claimed in claim 20 wherein stopping the clock comprises clock gating.

22. The integrated circuit as claimed in claim 16 wherein each of the power consumption signals includes temperature or power dissipation measurement.

23. An integrated circuit comprising:
a integrated circuit chip;
a plurality of power islands disposed on the integrated circuit chip having associated power consumptions, each of the power islands having a power consumption signal indicating a respective one of the power consumptions, each of the power consumptions being independently controllable by changing a supply voltage and operating frequency;
a power manager disposed on the integrated circuit chip coupled to each of the power islands and configured to monitor the power consumption signals, the power manager being configured to individually control each of the power consumptions, and the power manager being configured to change power consumption in at least one of the power islands in response to a power consumption change request.

24. The integrated circuit as claimed in claim 23 wherein the power manager comprises a processor configured to execute power management software to individually control each of the power consumptions.

25. The integrated circuit as claimed in claim 24 wherein one or more of the power consumptions is changed by selecting a non-zero supply voltage, stopping a clock and selecting one of plural threshold voltages of variable threshold transistors.

26. The integrated circuit as claimed in claim 24 wherein a first of the power islands is capable of communicating synchronously and asynchronously with a second of the power islands.

27. The integrated circuit as claimed in claim 23 wherein the power manager comprises a master power manager and a slave power manager associated with each of the power islands.

28. The integrated circuit as claimed in claim 23 wherein each of the power consumptions is further controlled by stopping a clock.

29. The integrated circuit as claimed in claim 28 wherein stopping the clock comprises clock gating.

30. The integrated circuit as claimed in claim 23 wherein each of the power consumption signals includes temperature or power dissipation measurement.

31. A system comprising:
an integrated circuit;
a plurality of power islands of the integrated circuit having associated power consumptions, each of the power consumptions being independently controllable by changing a supply voltage and operating frequency;
one or more power consumption signals indicating one or more of the power consumptions;
a power management processor coupled to each of the power islands configured to monitor the one or more power consumption signals, the power management processor being dedicated to execute power management software to individually control each of the power consumptions, and the power management processor being configured to change power consumption in at least one of the power islands in response to a power consumption change request.

32. The system as claimed in claim 31 wherein the power management software is embedded firmware.

33. The system as claimed in claim 32 wherein one or more of the power consumptions is changed by selecting a non-zero supply voltage, stopping a clock and selecting one of plural threshold voltages of variable threshold transistors.

34. The system circuit as claimed in claim 32 wherein a first of the power islands is capable of communicating synchronously and asynchronously with a second of the power islands.

35. The system as claimed in claim 31 wherein each of the power consumptions is further controlled by stopping a clock.

36. The system as claimed in claim 35 wherein stopping the clock comprises clock gating.

37. The system as claimed in claim 31 wherein the system is configured to have the supply voltage provided by an external regulator.

38. The system as claimed in claim 31 wherein the one or more power consumption signals include temperature or power dissipation measurement.

39. A system comprising:
an integrated circuit;
a plurality of power islands of the integrated circuit having associated power consumptions, each of the power consumptions being independently controllable by changing a supply voltage and operating frequency;
one or more power consumption signals indicating one or more of the power consumptions;
a power manager coupled to each of the power islands configured to monitor the one or more power consumption signals, the power manager being configured to individually control each of the power consumptions, and the power manager being configured to change power consumption in at least one of the power islands in response to a power consumption change request.

40. The system as claimed in claim 39 wherein the power manager comprises a processor configured to execute power management software to individually control each of the power consumptions.

41. The system as claimed in claim 40 wherein one or more of the power consumptions is changed by selecting a non-zero supply voltage, stopping a clock and selecting one of plural threshold voltages of variable threshold transistors.

42. The system as claimed in claim 40 wherein a first of the power islands is capable of communicating synchronously and asynchronously with a second of the power islands.

43. The system as claimed in claim 39 wherein the power manager comprises a master power manager and a slave power manager associated with each of the power islands.

44. The system as claimed in claim 39 wherein each of the power consumptions is further controlled by stopping a clock.

45. The system as claimed in claim 44 wherein stopping the clock comprises clock gating.

46. The system as claimed in claim 39 wherein the system is configured to have the supply voltage provided by an external regulator.

47. The system as claimed in claim 39 wherein the one or more power consumption signals include temperature or power dissipation measurement.

48. A system comprising:
an integrated circuit;
a plurality of power islands of the integrated circuit having associated power consumptions, each of the power islands having a power consumption signal indicating a respective one of the power consumptions, each of the power consumptions being independently controllable by changing a supply voltage and operating frequency;
a power management processor coupled to each of the power islands configured to monitor the power consumption signals, the power management processor being dedicated to execute power management software to individually control each of the power consumptions, and the power management processor being configured to change power consumption in at least one of the power islands in response to a power consumption change request.

49. The system as claimed in claim 48 wherein the power management software is embedded firmware.

50. The system as claimed in claim 49 wherein one or more of the power consumptions is changed by selecting a non-zero supply voltage, stopping a clock and selecting one of plural threshold voltages of variable threshold transistors.

51. The system as claimed in claim 49 wherein a first of the power islands is capable of communicating synchronously and asynchronously with a second of the power islands.

52. The system as claimed in claim 48 wherein each of the power consumptions is further controlled by stopping a clock.

53. The system as claimed in claim 52 wherein stopping the clock comprises clock gating.

54. The system as claimed in claim 48 wherein the system is configured to have the supply voltage provided by an external regulator.

55. The system as claimed in claim 48 wherein each of the power consumption signals includes temperature or power dissipation measurement.

56. A system comprising:
an integrated circuit;
a plurality of power islands of the integrated circuit having associated power consumptions, each of the power islands having a power consumption signal indicating a respective one of the power consumptions, each of the power consumptions being independently controllable by changing a supply voltage and operating frequency;
a power manager coupled to each of the power islands configured to monitor the power consumption signals, the power manager being configured to individually control each of the power consumptions, and the power manager being configured to change power consumption in at least one of the power islands in response to a power consumption change request.

57. The system as claimed in claim 56 wherein the power manager comprises a processor configured to execute power management software to individually control each of the power consumptions.

58. The system as claimed in claim 57 wherein one or more of the power consumptions is changed by selecting a non-zero supply voltage, stopping a clock and selecting one of plural threshold voltages of variable threshold transistors.

59. The system as claimed in claim 57 wherein a first of the power islands is capable of communicating synchronously and asynchronously with a second of the power islands.

60. The system as claimed in claim 56 wherein the power manager comprises a master power manager and a slave power manager associated with each of the power islands.

61. The system as claimed in claim 56 wherein each of the power consumptions is further controlled by stopping a clock.

62. The system as claimed in claim 61 wherein stopping the clock comprises clock gating.

63. The system as claimed in claim 56 wherein the system is configured to have the supply voltage provided by an external regulator.

64. The integrated circuit as claimed in claim 56 wherein each of the power consumption signals includes temperature or power dissipation measurement.

* * * * *